(12) United States Patent
Ito et al.

(10) Patent No.: US 6,200,888 B1
(45) Date of Patent: Mar. 13, 2001

(54) METHOD OF PRODUCING SEMICONDUCTOR DEVICE COMPRISING INSULATION LAYER HAVING IMPROVED RESISTANCE AND SEMICONDUCTOR DEVICE PRODUCED THEREBY

(75) Inventors: Daisuke Ito; Yuichi Kitahara, both of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/564,682

(22) Filed: May 4, 2000

(30) Foreign Application Priority Data

May 7, 1999 (JP) .................................................. 11-127120

(51) Int. Cl.⁷ .................................................. H01L 21/44
(52) U.S. Cl. ............................ 438/597; 438/598; 438/599
(58) Field of Search ..................................... 438/597, 598, 438/599

(56) References Cited

U.S. PATENT DOCUMENTS 5,304,510 * 4/1994 Suguro et al. ........................ 437/195
5,470,791 * 11/1995 Suguro et al. ........................ 437/192
5,654,237 * 8/1997 Suguro et al. ........................ 438/624

FOREIGN PATENT DOCUMENTS 2-246246   10/1990   (JP) .

* cited by examiner

*Primary Examiner*—Richard Booth
*Assistant Examiner*—Lynne A. Gurley
(74) *Attorney, Agent, or Firm*—Pennie & Edmonds LLP

(57) ABSTRACT

A semiconductor device comprising an insulation film covering a semiconductor chip so as to expose electrodes or pads fabricated in the chip and wiring lines located on the insulation film and connected to the respective electrodes or pads is produced by a method which comprises: providing a semiconductor chip provided with an insulation film covering the chip so as to expose a conductor layer for electrodes or pads fabricated in the chip, ion milling the surface of the chip provided with the insulation film by a mixed gas of argon and hydrogen, forming a patterned conductor layer for wiring lines on the ion-milled surface of the chip, and dry etching the surface of the chip provided with the insulation film and the patterned conductor layer by nitrogen gas.

12 Claims, 11 Drawing Sheets

○ : SAMPLE 1
□ : SAMPLE 2
△ : SAMPLE 3

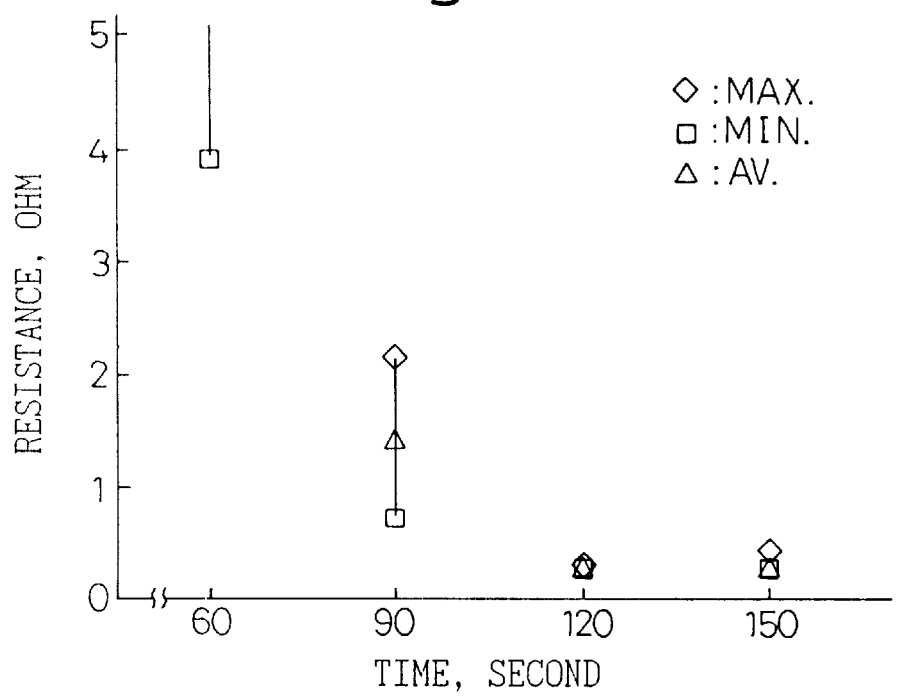
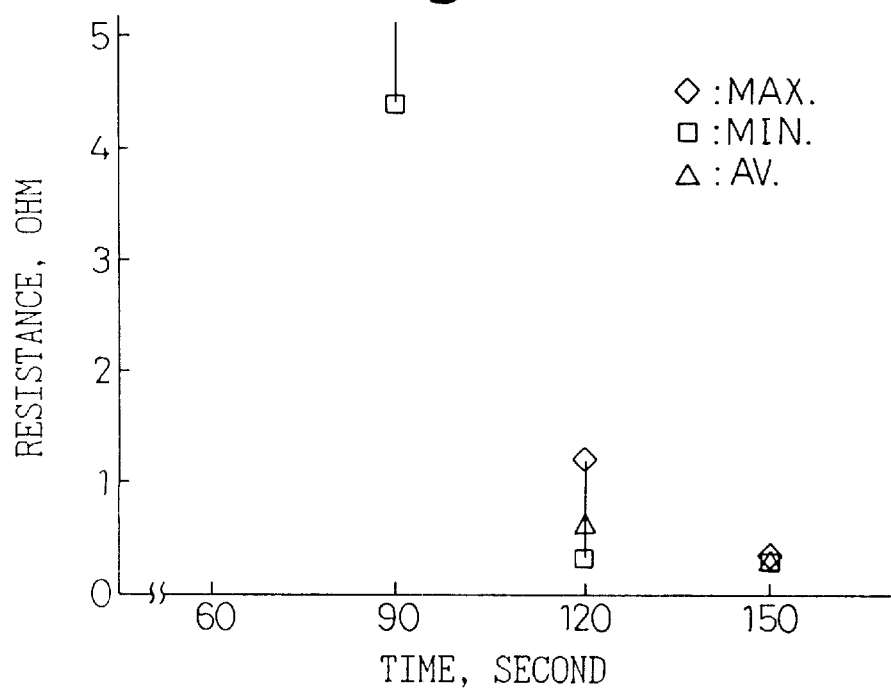

METHOD OF PRODUCING SEMICONDUCTOR DEVICE COMPRISING INSULATION LAYER HAVING IMPROVED RESISTANCE AND SEMICONDUCTOR DEVICE PRODUCED THEREBY

BACKGROUND OF THE INVENTION

1. Field of the Invention

The invention relates to a semiconductor device and a method of producing the same. Particularly, the invention relates to a semiconductor device, such as one having a chip size package (CSP) structure, in which a surface of the semiconductor chip is covered by a layer of insulation material, such as a layer of polyimide, and a layer of aluminum (Al) forming electrodes or pads at the surface of the chip is not covered by the insulation material layer and is exposed.

As used herein, the term "semiconductor chip" means each of the individual semiconductor elements which are fabricated in a wafer and are not yet cut from the wafer as well as each of individual semiconductor elements which are cut from the wafer and separated from each other, unless specifically indicated.

2. Description of the Related Art

In a typical and conventional semiconductor device, an Al layer, which provides electrodes, is formed on a chip of silicon (Si), and it is common that wiring lines are attached to the electrodes of the Al layer by wire bonding.

In a semiconductor device of a CSP structure which has been developed to meet the latest needs of miniaturization of semiconductor devices and fabrication of components therein at a higher density, a polyimide layer as an insulation film is formed on a wafer in which many semiconductor elements (semiconductor chips) are fabricated and, on the polyimide layer, rerouting lines are formed, the rerouting line connecting an electrode or pad of conductor layer, typically Al layer, of each semiconductor chip through a via-hole formed in the polyimide layer to an external electrical circuit outside a package. In other words, the semiconductor device of a CSP structure requires a process for making rerouting lines on the insulation film of the chip so that the rerouting lines are electrically connected with the conductor layer of the chip.

In all of the cases where a wiring line is thus attached to an electrode or pad of an Al layer of a semiconductor chip, the electrodes or pads of the Al layer are exposed and, consequently, an oxidized film formed due to natural oxidation, so-called a "naturally oxidized film", is present on the surface of the Al layer. The presence of such an oxidized film is not preferable in that it increases a contact resistance between the electrode or pad and wiring line to be connected with it, and eventually makes electrical continuity between them defective. Accordingly, a treatment for the removal of such an oxidized film is needed.

In a process in which a wiring line is attached by wire bonding, a satisfactory electrical connection between an electrode (an Al layer) of a chip and the wiring line is established by using, for example, ultrasound or heat to mechanically break the oxidized film.

On the other hand, in a process in which rerouting lines are formed on an insulation film of a chip, satisfactory electrical connection between an electrode (an Al layer) of a chip and the rerouting line is established by removing the oxidized film by, for example, a treatment in which positive ions, typically Argon ions ($Ar^+$), in a plasma are accelerated and are bombarded against the surfaces of the respective chips of a target wafer (ion bombardment or ion milling) is carried out prior to the formation of a metallic thin film for the rerouting lines by sputtering.

However, such an ion bombardment simultaneously has also effect on the surface of the polyimide layer as an insulation film exposed at the top of the wafer, resulting in breakage of some of bonds between atoms in the polyimide layer and loss of its insulation properties. Consequently, the insulation resistance of the polyimide layer can be largely decreased.

Such a problem is not desired in a semiconductor device having a CSP structure, but can commonly arise with a semiconductor device if the device generally has an insulation film, such as a layer of polyimide, covering the surface of a semiconductor chip, and an Al layer for electrodes or pads is not covered by the polyimide layer and is exposed.

SUMMARY OF THE INVENTION

It is an object of the invention to provide a method of producing a semiconductor device comprising an insulation film covering a semiconductor chip so as to expose electrodes or pads fabricated in the chip and wiring lines formed on the insulation film and connected to the respective electrodes or pads, the insulation film having sufficient insulation properties, and the electrode of the chip being satisfactorily connected to the wiring line on the insulation film.

It is another object of the invention to provide such a semiconductor device.

According to the invention, a semiconductor device comprising an insulation film covering a semiconductor chip so as to expose electrodes or pads fabricated in the chip and wiring lines located on the insulation film and connected to the respective electrodes or pads is produced by a method which comprises:

providing a semiconductor chip provided with an insulation film covering the chip so as to expose a conductor layer for electrodes or pads fabricated in the chip, ion milling the surface of the chip, provided with the insulation film, by a mixed gas of argon and hydrogen, forming a patterned conductor layer for wiring lines on the ion-milled surface of the chip, and dry etching the surface of the chip provided with the insulation film and the patterned conductor layer by nitrogen gas.

In the method of the invention, prior to the formation of the patterned conductor layer for wiring lines on the insulation film, the surface of the chip provided with the insulation film is ion-milled to remove a naturally oxidized film at the surface of the conductor layer for electrodes (or pads) by ion bombardment. This makes it possible to establish satisfactory electrical connection between the electrodes of the chip and the wiring line which is subsequently formed.

The ion milling is carried out using the mixed gas of argon and hydrogen, which can reduce a decrease in the insulation resistance of the insulation film due to the ion bombardment, compared with the case of the use of prior ion milling gas consisting of argon alone.

Also, in the method of the invention, after the formation of the patterned conductor layer for wiring lines on the insulation film, the surface of the chip provided with the insulation film is sputter-etched using nitrogen gas, unlike argon gas of prior art, which can restore an insulation resistance of the insulation film, which may have been more or less lowered by the former ion milling, to a sufficient value.

By the combination of the ion milling using a mixed gas of argon and hydrogen and the dry etching using nitrogen gas, the invention can provide a semiconductor device comprising an insulation film covering a semiconductor chip so as to expose electrodes or pads fabricated in the chip and wiring lines located on the insulation film and connected to the respective electrodes or pads, the insulation film having sufficient insulation properties, and the electrode of the chip being satisfactorily connected to the wiring line on the insulation film to secure electrical continuity between them.

The invention also provides a semiconductor device produced by the method of the invention, the semiconductor device comprising an insulation film covering a semiconductor chip so as to expose electrodes or pads fabricated in the chip and wiring lines located on the insulation film and connected to the respective electrodes or pads, wherein the insulation film is ion-milled by a mixed gas of argon and hydrogen, and is also sputter-etched by nitrogen gas.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein:

FIG. 9 shows the relation between a processing time for the ion milling and a resistance between two points in the wiring line layer processed at an $H_2$ content of 10% by volume, FIG. 10 shows the relation between a processing time for the ion milling and a resistance between two points in the wiring line layer processed at an $H_2$ content of 33% by volume.

DETAILED DESCRIPTION OF THE INVENTION

A semiconductor device having a CSP structure of an embodiment of the invention is described, making reference to FIGS. 1 to 4, which illustrate a process for the production thereof, by way of example.

Figure 1A:
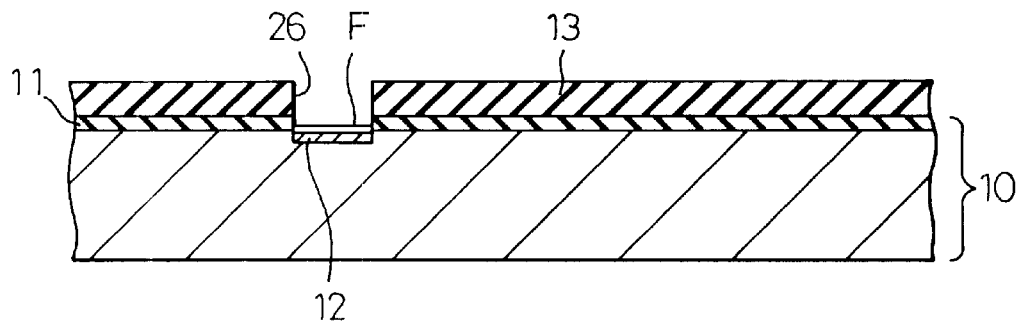
FIGS. 1A to 1C illustrate a first quarter of an embodiment of the method of producing a semiconductor device according to the invention.

In a first step illustrated in FIG. 1A, a wafer 10 is prepared in which a plurality of semiconductor chips (not shown) are fabricated by a well-known process. The wafer 10 is provided, on its surface, with a passivation film 11 as a protective film made up of silicon nitride (SiN), a phosphosilicate glass (PSG) or the like, the passivation film 11 having openings to expose electrodes or pads 12 of an aluminum (Al) layer formed in each of the semiconductor chips in a predetermined pattern. In lieu of the use of the passivation film 11, a polyimide film to be subsequently formed may be designed to also act as a passivation film. Also, in lieu of the use of aluminum, a layer of the electrodes or pads 12 may be made of an alloy of aluminum, or copper or an alloy of copper.

A photosensitive polyimide as a resist is then coated on the surface of the wafer 10 provided with the passivation film 11 to provide a resist film, and is soft-baked (prebaked). Subsequently, the resist film is exposed using a mask (not shown), is developed to be patterned, and is then hard-baked (post-baked), to thereby provide an insulation film (polyimide layer) 13 having openings (via-holes) 26 reaching and exposing the electrode or pad 12. The insulation film 13 may be formed of polybenzoxazole (PBO).

The wafer 10 thus prepared has the polyimide layer 13 covering the surface of the wafer 10 except for the electrodes or pads 12. At the exposed surface of the electrode or pad 12, a naturally oxidized film, which is identified by "F" in the drawing, is formed, as earlier described.

Figure 1B:
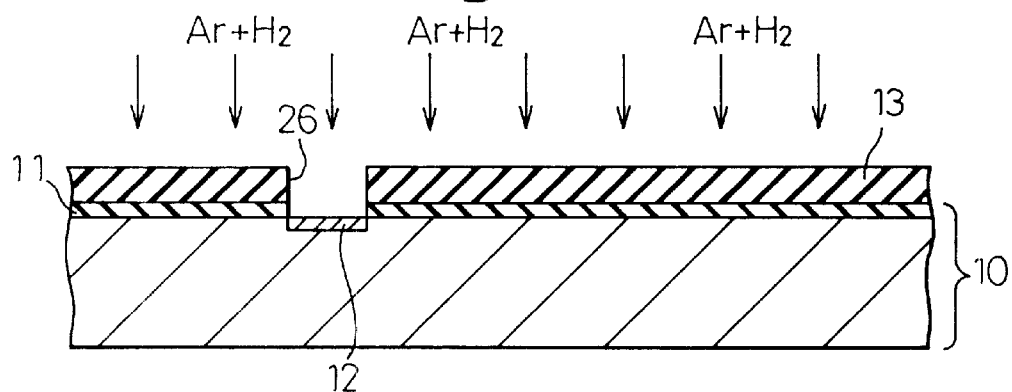

In the subsequent step illustrated in FIG. 1B, the surface of the wafer provided with the polyimide layer 13 is subjected to ion milling using a mixed gas of argon (Ar) and hydrogen ($H_2$). To this end, a plasma of a mixed gas, of $Ar+H_2$, is generated by an ion gun (not shown), and ions in the plasma are accelerated by applying a high voltage to a grid (not shown), to be bombarded against the surface of the wafer 10. The ion milling removes the naturally oxidized film at the surface of the electrode or pad 12 of the aluminum layer.

Figure 1C:
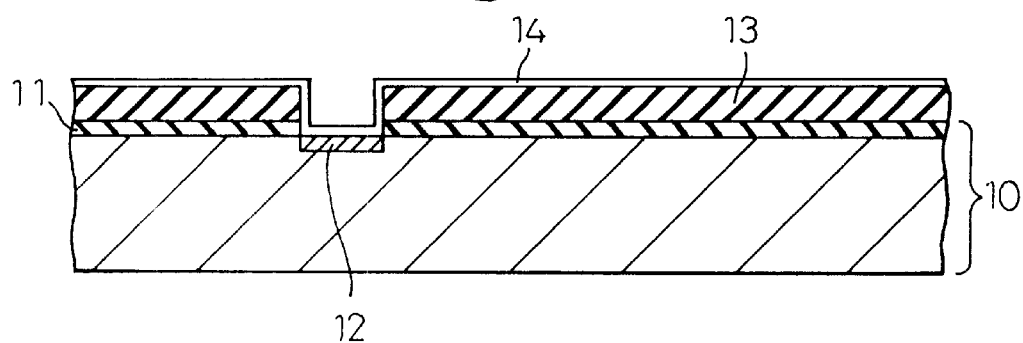

In the subsequent step illustrated in FIG. 1C, a metallic film 14 is formed on the entire surface of the wafer 10 subjected to the ion milling, by sputtering in a vacuum atmosphere. In the embodiment described herein, the metallic film 14 is formed of two layers, i.e., an adhering metal layer (chromium (Cr) layer in this embodiment) and a copper (Cu) layer located thereon. The formation of the metallic film 14 of two layer structure is carried out by depositing Cr on the entire surface of the wafer 10 by sputtering to form an underlying adhering metal layer (Cr layer), and further depositing Cu thereon by sputtering to form an overlaying Cu layer having a thickness of several thousands angstroms.

Figure 2A:
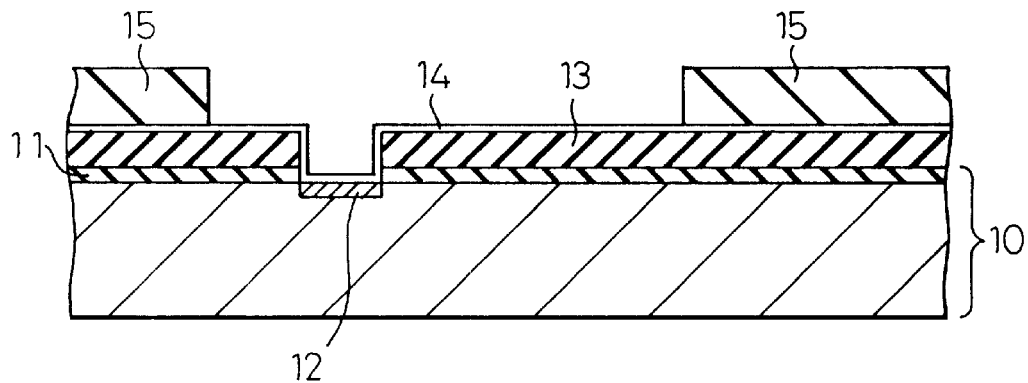
FIGS. 2A to 2C illustrate a second quarter of the embodiment of the method according to the invention.

In the subsequent step illustrated in FIG. 2A, a film of photosensitive resist, such as a dry film, is formed on the metallic film 14, is then exposed using a mask (not shown), and is developed to provide a patterned resist film 15.

Figure 2B:
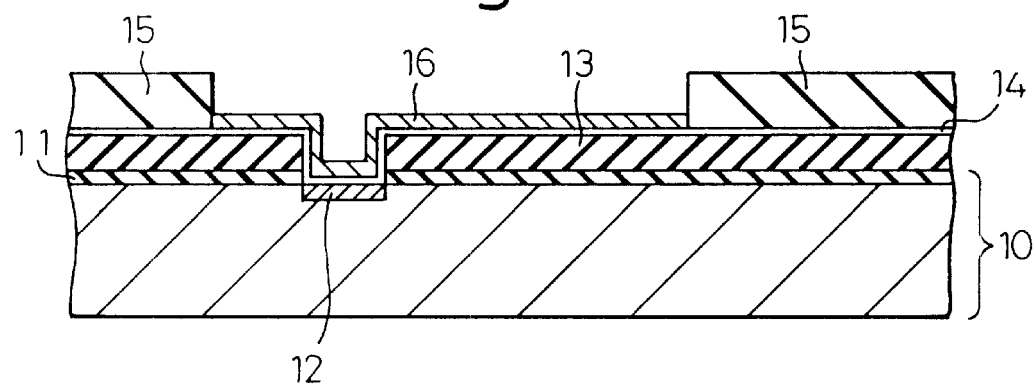

In the subsequent step illustrated in FIG. 2B, a patterned wiring line layer 16 of Cu having a thickness of several tens micrometers is formed by electrolytic plating using the patterned resist film 15 as a mask and the metallic film 14 as an electrical power supply layer. The wiring line layer 16 may be made of a material other than Cu, such as an alloy of Cu, or Al or an alloy of Al. The patterned wiring line layer 16 thus formed is also called "rerouting line layer".

Figure 2C:
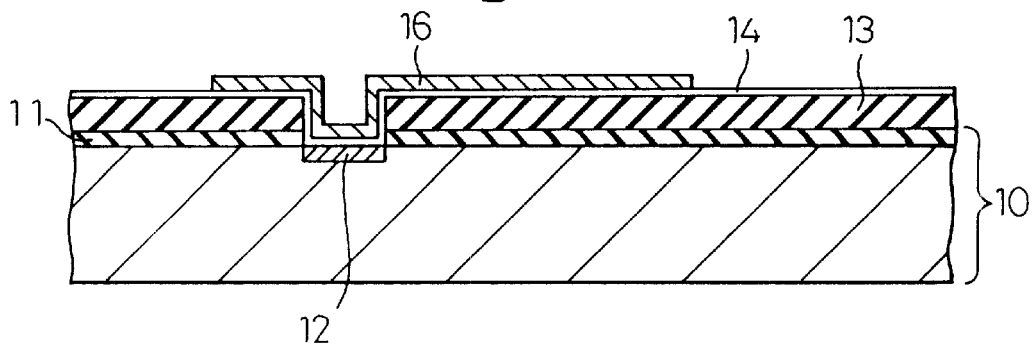

In the subsequent step shown in FIG. 2C, the dry film, i.e., the resist film 15 (FIG. 2B), is peeled for its removal using a resist peeling solution, such as an aqueous solution of sodium hydroxide (NaOH).

Figure 3A:
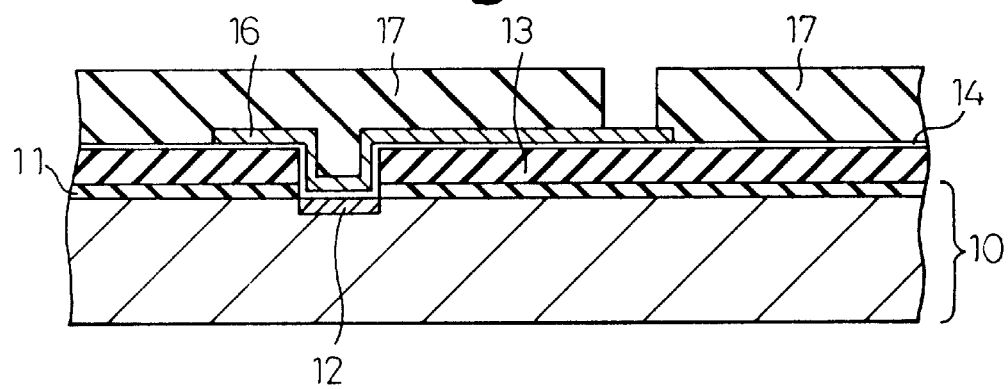
FIGS. 3A to 3C illustrate a third quarter of the embodiment of the method according to the invention.

In the subsequent step illustrated in FIG. 3A, a film of photosensitive resist, such as a dry film, is formed so as to cover the metallic film 14 and the wiring line layer 16, is then exposed using a mask (not shown), and is developed to form a patterned resist film 17 having openings which expose part of the wiring line layer 16.

Figure 3B:
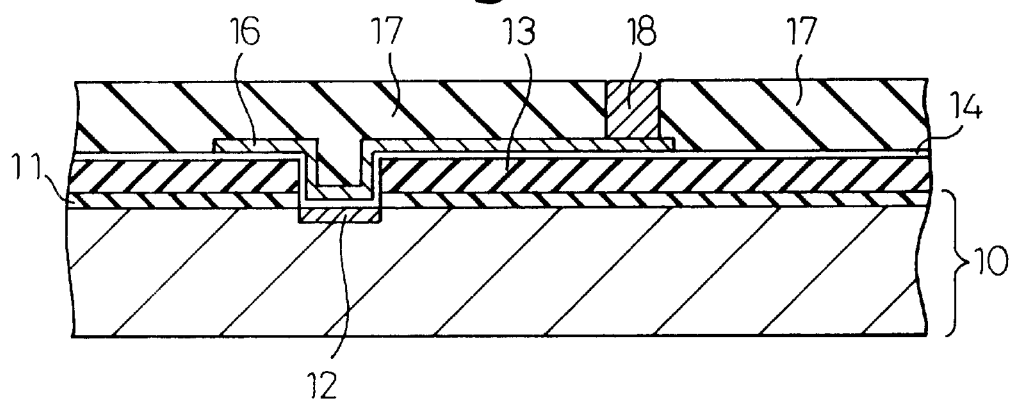

In the subsequent step illustrated in FIG. 3B, via posts 18 are formed by electrolytic plating using the patterned resist film 17 as a mask and the metallic film 14 as an electrical power supply layer. A barrier metal layer (not shown) may be additionally formed on the top of the via post 18 also by electrolytic plating, as required. The via post 18 is used as a means to connect a product semiconductor device to an external electrical circuit.

Figure 3C:
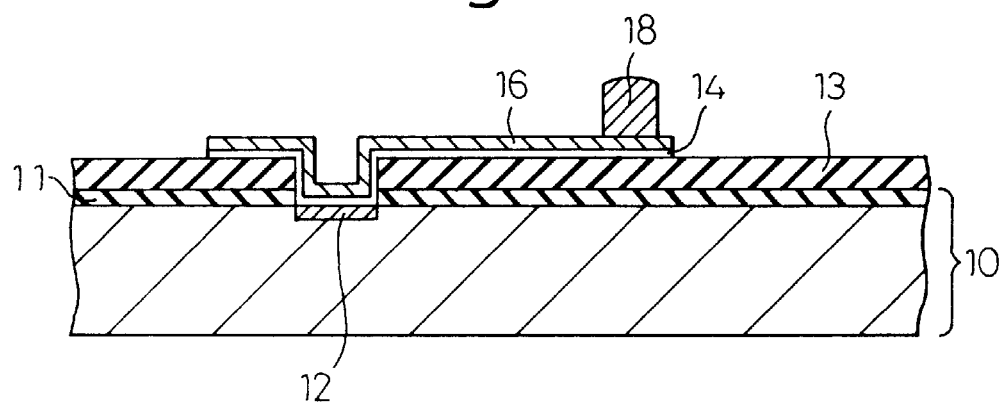

In the subsequent step shown in FIG. 3C, the dry film, i.e., the resist film 17 (FIG. 3B), is peeled, for its removal, using a resist peeling solution, such as a solution of sodium hydroxide (NaOH), to expose the metallic film 14 and the wiring line layer 16. The exposed metallic film 14 is then removed by etching. To this end, the upper layer of Cu of the film 14 is first removed using an etchant in which Cu is dissolved, and the lower layer of Cr of the film 14 is then removed using an etchant in which Cr is dissolved. As a result, the polyimide layer 13 is exposed as shown in the drawing.

Although it may seem that the use of the etchant in which Cu is dissolved leads to removal of Cu material of the wiring line layer 16 and loss of electrical continuity of the patterned wiring lines, such a disadvantage is not encountered in practice. This is because the Cu overlayer of the metallic film 14 is formed by sputtering and has a very small thickness of the order of several thousands angstroms accordingly, whereas the wiring line layer 16 is formed by plating with Cu and has a very large thickness of several tens micrometers, as earlier referred to; therefore, even when the Cu overlayer of the film 14 is completely removed, the Cu material of the wiring line layer 16 is only partially removed at the surface of the layer 16, and the patterned wiring lines never lose their electrical continuity.

Figure 4A:
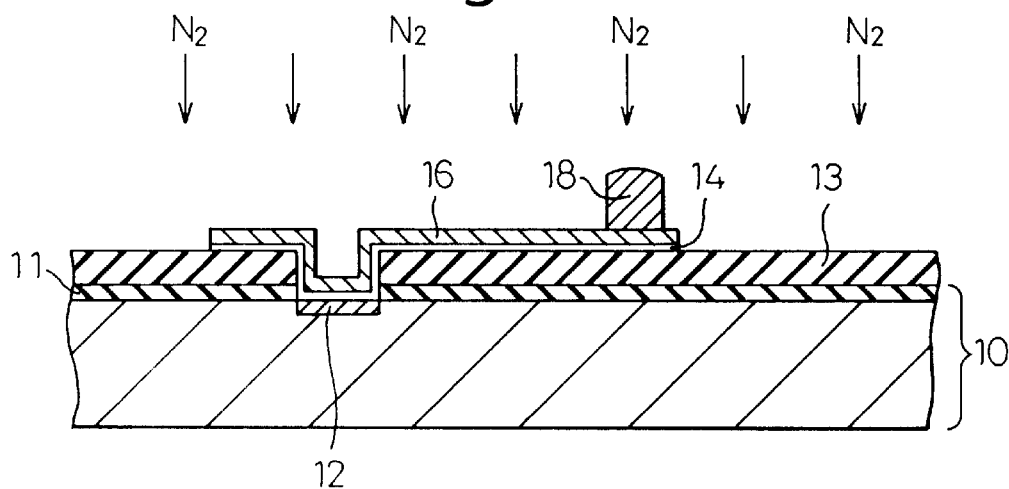
FIGS. 4A to 4C illustrate a last quarter of the embodiment of the method according to the invention.

In the subsequent step shown in FIG. 4A, the surface of the polyimide layer 13, which is now exposed, is subjected to dry etching using nitrogen ($N_2$) gas, as illustrated in the drawing. This dry etching restores an insulation resistance of the polyimide layer 13 which may have been more or less lowered by the former ion milling to a sufficient value. The dry etching using nitrogen gas may be sputter etching or chemical dry etching (reactive plasma etching).

Figure 4B:
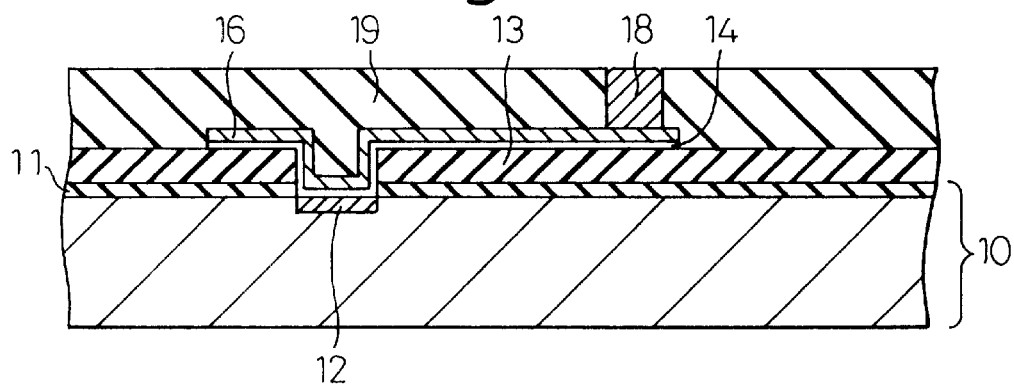

In the subsequent step illustrated in FIG. 4B, the wafer 10 provided with the wiring line layer 16 (rerouting line layer) accompanied by the via posts 18 is encapsulated by a resin. This is carried out using a well-known method such as those known from Japanese Unexamined Patent Publication (Kokai) No. 10-79362 (JP-A-10-79362), as follows.

First, an encapsulating mold (not shown) having top and bottom members is prepared and is heated to a predetermined temperature. A resin film is then attached to the lower face of the top member by sucking, the wafer 10 is placed on the bottom member, and a thermoset resin having a great adhesion is placed on the wafer 10. The resin is then melted and extended over the entire surface of the wafer 10 by heat of the mold and pressure by pressing, so as to expose the top ends of the respective via posts 18, and is set in the mold. Subsequently, the encapsulated wafer 10 accompanied by the resin film is removed from the mold, and the resin film is then peeled from the wafer 10. In this way, the wafer 10 having the surface covered with an encapsulating resin 19 so as to expose the top ends of the via posts 18 is obtained, as shown in FIG. 4B.

Figure 4C:
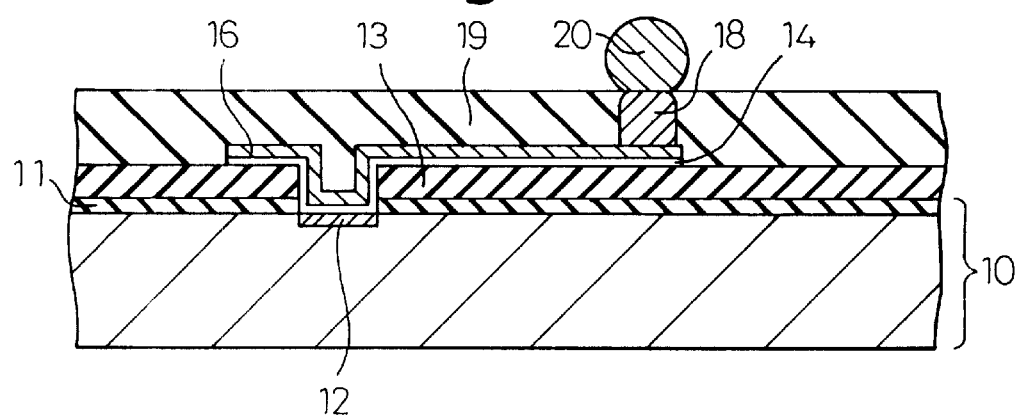

In the last step illustrated in FIG. 4C, a solder ball 20 is placed on the exposed top end of the via post 18, and is reflowed to be fixed to the via post 18.

Subsequently, the wafer 10 provided with the wiring line layer 16, via posts 18 with solder balls 20, and the layer of encapsulating resin 19 is cut by dicer or the like into individual semiconductor elements (i.e., semiconductor chips).

Figure 5A:
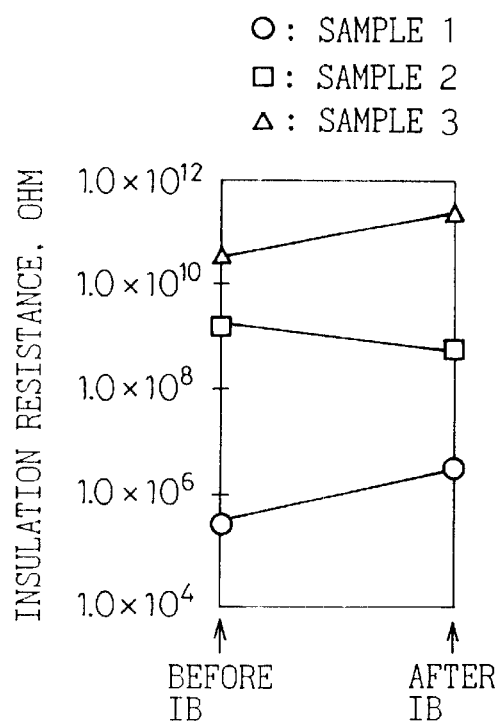
FIG. 5A shows changes in insulation resistances of polyimide layers before and after being subjected to an ion beam for the ion milling according to the invention.
Figure 5B:
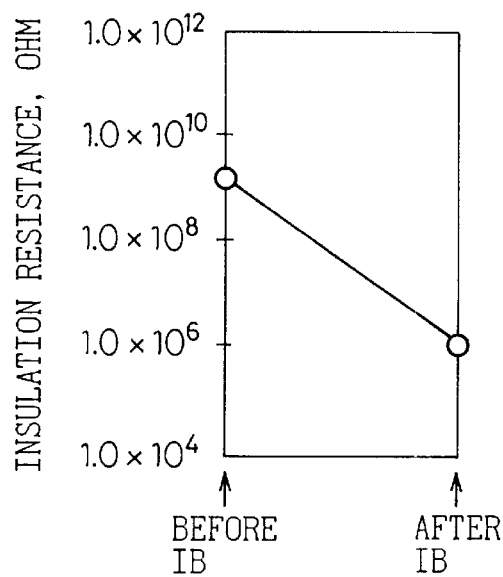
FIG. 5B shows change in insulation resistance of a polyimide layer before and after being subjected to an ion beam for the prior art ion milling.

FIGS. 5A and 5B show changes in insulation resistances of polyimide layers 13 before and after being subjected to an ion beam (IB) for the ion milling illustrated in FIG. 1B. FIG. 5A represents the case of the use of a mixed gas of Ar+$H_2$ (example of the invention), and FIG. 5B represents the case of the use of Ar only (comparative example). All experiments were conducted under the following conditions: Ar flow rate of 9 sccm, beam voltage of 700 volts, base pressure of $8\times10^{-7}$ millibars, processing pressure of $6\times10^{-4}$ millibars, and processing time of 5 seconds. Further, in the experiments of the invention, $H_2$ was fed at a flow rate of 1.0 sccm in addition to Ar, the $H_2$ flow rate being 10% by volume of the total of Ar and $H_2$ flow rates.

In the example of the invention, three samples (samples 1 to 3) respectively showed insulation resistances of $5.6\times10^5$ ohms, $1.6\times10^9$ ohms, and $3.8\times10^{10}$ ohms, before being subjected to the ion beam (which is indicated in the drawings as "Before IB"), and $1.5\times10^7$ ohms, $7.6\times10_8$ ohms, and $2.5\times10^{11}$ ohms, after being subjected to the ion beam (which is indicated in the drawings as "After IB"). In the comparative example, a sample showed an insulation resistances of $1.8\times10^9$ ohms and $8.3\times10^5$ ohms before and after being subjected to the ion beam, respectively.

The above results reveal that in the comparative example using only Ar gas for the ion milling, the polyimide layer showed a largely reduced insulation resistance after the ion milling (see FIG. 5B), whereas in the example of the invention using the mixed gas of Ar and $H_2$ for the ion milling, the samples showed an improved or, at the worst, only slightly reduced insulation resistance (see FIG. 5A).

Figure 6A:
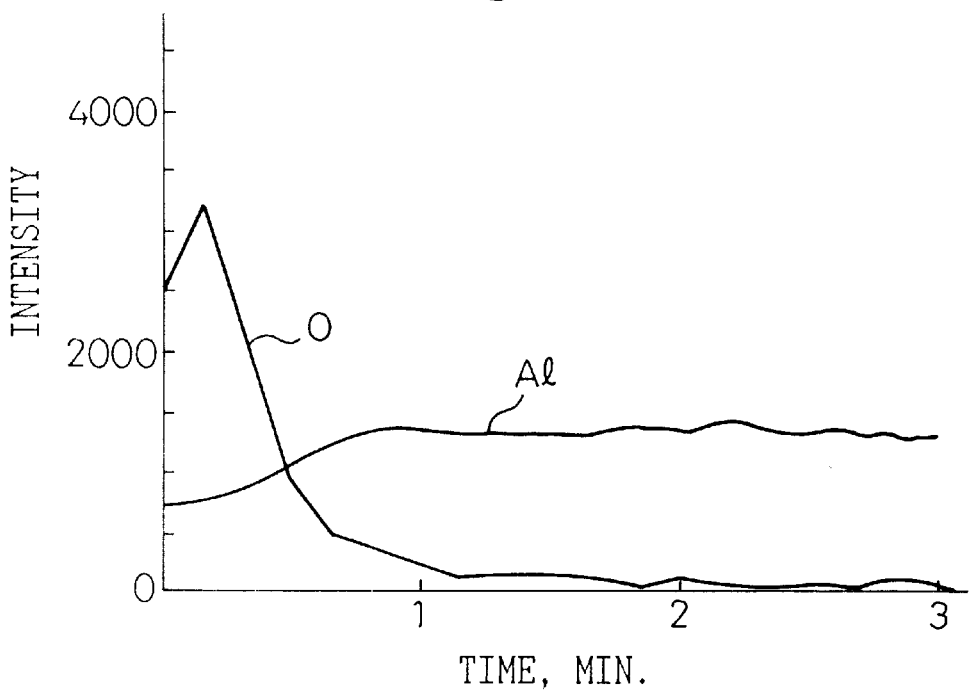
FIGS. 6A and 6B show profiles of elements in the direction of depth of a semiconductor chip.
Figure 6B:
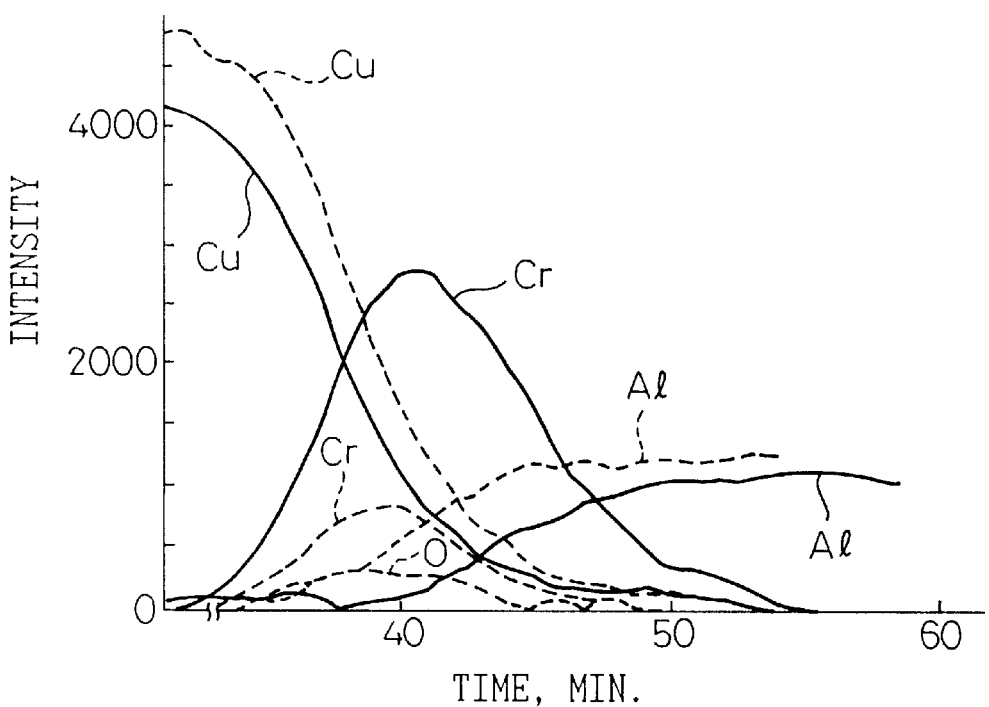

FIGS. 6A and 6B show profiles of elements in the direction of depth of a semiconductor chip measured using a combination of sputter etching by Ar gas with Auger electron spectroscopy.

FIG. 6A shows results obtained using a sample having electrodes or pads 12 before being subjected to the ion milling illustrated in FIG. 1B, which had a surface at which a naturally oxidized film F (FIG. 1A) was formed. In this drawing, changes in compositions of elements (in this case, aluminum (Al) and oxygen (O)) present in the vertical plane including the Al layer 12 are shown against processing time (time for sputter etching).

FIG. 6B shows changes in compositions of elements (in this case, Al, Cr, Cu, and O) present in the vertical plane including the Al layer 12 in the step illustrated in FIG. 1C are shown against processing time. The curves of solid lines show profiles of the Al layer 12 which is in the state of having the surface oxidized film F approximately completely removed (which represents an example of the invention using a mixed gas of 90% Ar and 10% $H_2$), and the curves of broken lines show profiles of the Al layer 12 which is in the state of having a surface oxidized film F which was not completely removed (which represents a comparative example using only Ar gas).

Figure 7:
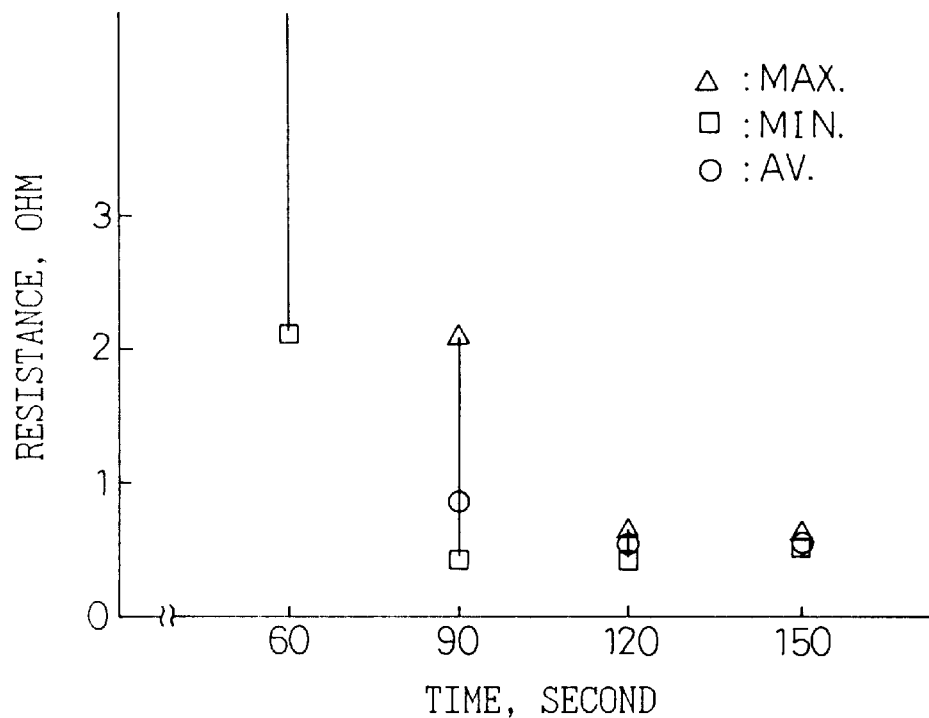
FIG. 7 shows the relation between a processing time for the ion milling and a resistance between two points in the wiring line layer processed at an $H_2$ content of 10% by volume.

FIG. 7 shows the relation between a processing time for the ion milling (time for directing an ion beam to the polyimide layer 13) and a resistance between two points in the wiring line layer 12. Herein, the resistance between two points in the wiring line layer means the total electrical resistance between an arbitrary set of two electrodes in the wiring line layer 12, including a resistance of a wiring line interconnecting the electrodes.

Electrical resistance was measured between an arbitrary set of two electrodes in the wiring line layer 12 at the conditions of beam voltage of 1200 volts, and an Ar flow rate of 10 sccm and an $H_2$ flow rate of 1 sccm (10% by volume of the total of Ar and $H_2$ flow rates). The resistances measured, which are plotted in FIG. 7, were as follows:

| | Resistances Measured, ohms | | | |
|---|---|---|---|---|
| | Time for Ion Milling | | | |
| | 60 sec. | 90 sec. | 120 sec. | 150 sec. |
| Maximum | 30.31 | 2.08 | 0.66 | 0.69 |
| Minimum | 2.39 | 0.45 | 0.46 | 0.50 |
| Average | 13.21 | 0.85 | 0.58 | 0.59 |

Figure 8:
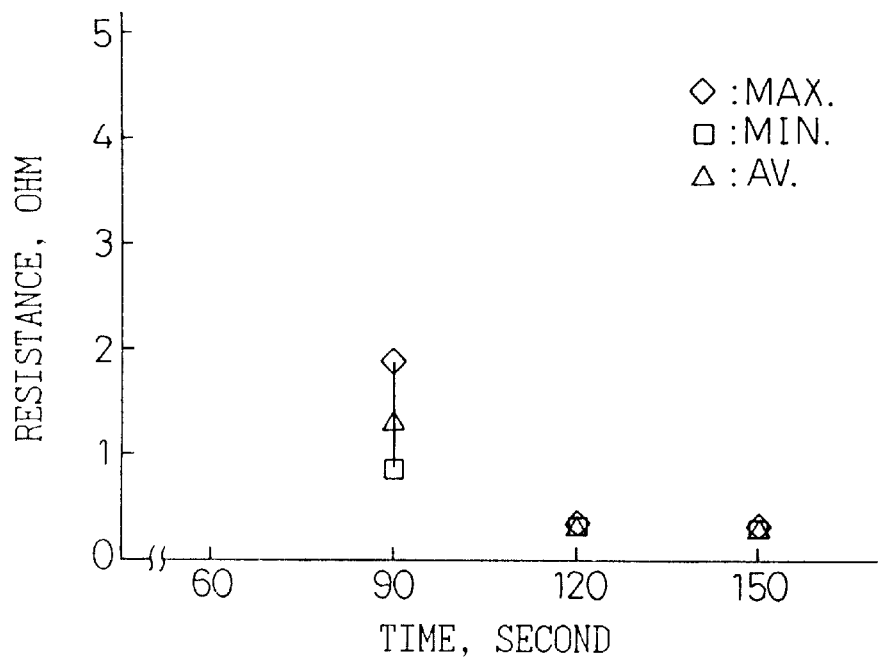
FIG. 8 shows the relation between a processing time for the ion milling and a resistance between two points in the wiring line layer processed at an $H_2$ content of 5% by volume.

Similar experiments were conducted, and results shown in the tables below and in FIGS. 8 to 10 were obtained. Herein, resistances were also measured at beam voltage of 1200 volts, and the following flow rate conditions:

(1) Ar flow rate of 10 sccm and $H_2$ flow rate of 0.5 sccm (5% by volume of $H_2$), (2) Ar flow rate of 10 sccm and $H_2$ flow rate of 1.0 sccm (10% by volume of $H_2$), and (3) Ar flow rate of 10 sccm and $H_2$ flow rate of 5.0 sccm (33% by volume of $H_2$).

| | Time for Ion Milling | | | |
|---|---|---|---|---|
| | 60 sec. | 90 sec. | 120 sec. | 150 sec. |
| | Resistances Measured at 5% $H_2$, ohms | | | |
| Maximum | — | 1.893 | 0.353 | 0.344 |
| Minimum | — | 0.854 | 0.324 | 0.299 |
| Average | — | 1.320 | 0.331 | 0.327 |
| | Resistances Measured at 10% $H_2$, ohms | | | |
| Maximum | 16.002 | 2.173 | 0.321 | 0.455 |
| Minimum | 3.908 | 0.729 | 0.287 | 0.280 |
| Average | 8.103 | 1.428 | 0.302 | 0.323 |
| | Resistances Measured at 33% $H_2$, ohms | | | |
| Maximum | — | 23.350 | 1.202 | 0.353 |
| Minimum | — | 4.390 | 0.336 | 0.290 |
| Average | — | 12.080 | 0.634 | 0.339 |

These results reveal that a time for directing an ion beam for the ion milling of at least 90 seconds or longer drastically lowers the resistance between two points in the wiring line layer, which implies that satisfactory electrical connection will be established between an electrode or pad and a wiring line connected thereto of a semiconductor chip.

The results also reveal that an increased content of $H_2$ in an ion milling gas increased a processing time for the removal of a naturally oxidized Al layer at the surface of a wiring line layer, although it was expected that the more the $H_2$ concentration, the larger its reducing effect, and the oxidized Al layer can be removed in a shorter time. It is understood that an increased content of $H_2$ increases a total pressure of a mixed gas of Ar+$H_2$, and lessens the energy of bombarding Ar ions. Consequently, in the invention, the ion milling gas preferably contains 5 to 33% by volume of $H_2$ and 95 to 67% by volume of Ar. More preferably, the ion milling gas contains 5 to 10% by volume of $H_2$ and 95 to 90% by volume of Ar.

Figure 11A:
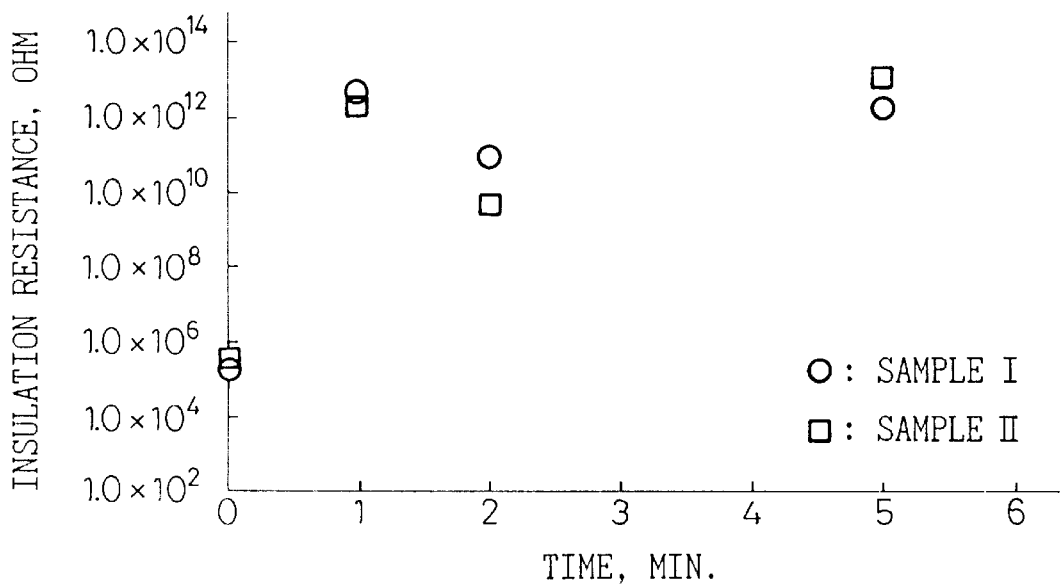
FIGS. 11A and 11B show the relations between processing times and insulation resistances of polyimide layers of an example of the invention and a comparative example, respectively.
Figure 11B:
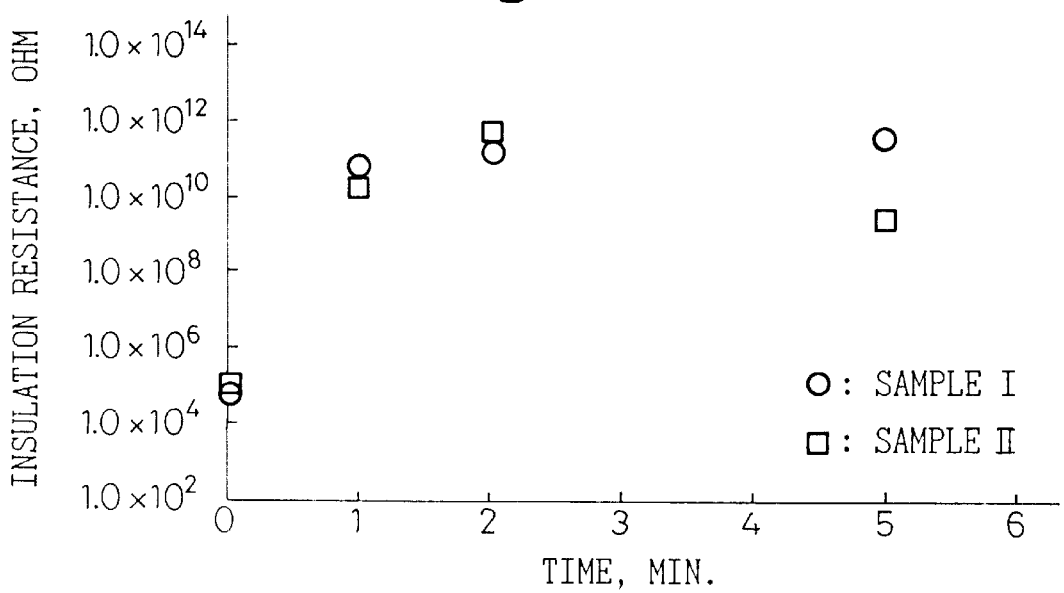

FIGS. 11A and 11B demonstrate restoration of insulation resistances of polyimide layers 13 by sputter etching using $N_2$ gas in the step illustrated in FIG. 4A. FIG. 11A represents the case of the use of 90% Ar+10% $H_2$ for the ion milling in the step illustrated in FIG. 1B (example of the invention), and FIG. 11B represents the case of the use of Ar only (comparative example). The ion milling was carried out at the same conditions as those used before except that the processing time was 300 seconds (5 minutes) herein.

In both examples, two samples were used. In the example of the invention, the samples respectively showed the following insulation resistances at the respective processing times (times for sputter etching).

EXAMPLE OF THE INVENTION

| | Insulation Resistances, ohms | |
|---|---|---|
| Processing Time, min. | Sample I | Sample II |
| 0 | $3.0 \times 10^5$ | $3.7 \times 10^5$ |
| 1 | $2.3 \times 10^{12}$ | $1.9 \times 10^{12}$ |
| 2 | $1.2 \times 10^{11}$ | $9.3 \times 10^9$ |
| 5 | $1.3 \times 10^{12}$ | $2.0 \times 10^{13}$ |

Comparative Example

| | Insulation Resistances, ohms | |
|---|---|---|
| Processing Time, min. | Sample I | Sample II |
| 0 | $3.7 \times 10^4$ | $4.2 \times 10^4$ |
| 1 | $7.0 \times 10^{10}$ | $2.8 \times 10^{10}$ |
| 2 | $1.6 \times 10^{11}$ | $3.9 \times 10^{11}$ |
| 5 | $8.3 \times 10^{10}$ | $4.0 \times 10^9$ |

These results reveal that the insulation resistances of the polyimide layer 13 of the samples of the example of the invention using a mixed gas of Ar+$H_2$ for the ion milling were restored to values in the order of approximately $10^{11}$ to $10^{12}$, which were relatively higher than those of the comparative example using only Ar gas.

As described, according to the invention, ion milling by a mixed gas of Ar+$H_2$ is applied to a wafer 10 provided on the surface with a polyimide film 13 formed so as to expose parts (electrodes or pads 12) of underlying patterned wiring line layer, as illustrated in FIG. 1B, and the ion milling can effectively remove a naturally oxidized film F at the surface of the exposed parts of the wiring line layer by ion bombardment. Accordingly, when a metallic film 14 for rerouting is formed by sputtering in the subsequent step illustrated in FIG. 1C, the contact resistance between the formed metallic film 14 and the electrodes or pads 12 is smaller, and satisfactory electrical connection can be established between them.

Also, the use of a mixed gas of $Ar+H_2$ for the ion milling enables an insulation resistance of the polyimide layer 13 to be less reduced, or even to be enhanced, as shown in FIG. 5A.

In addition, according to the invention, sputter etching by $N_2$ gas is conducted at the stage of the polyimide layer 13 being re-exposed after the formation of rerouting line layer 16, as illustrated in FIG. 4A, which can restore an insulation resistance of the polyimide layer 13 to a sufficient value.

Figure 12:
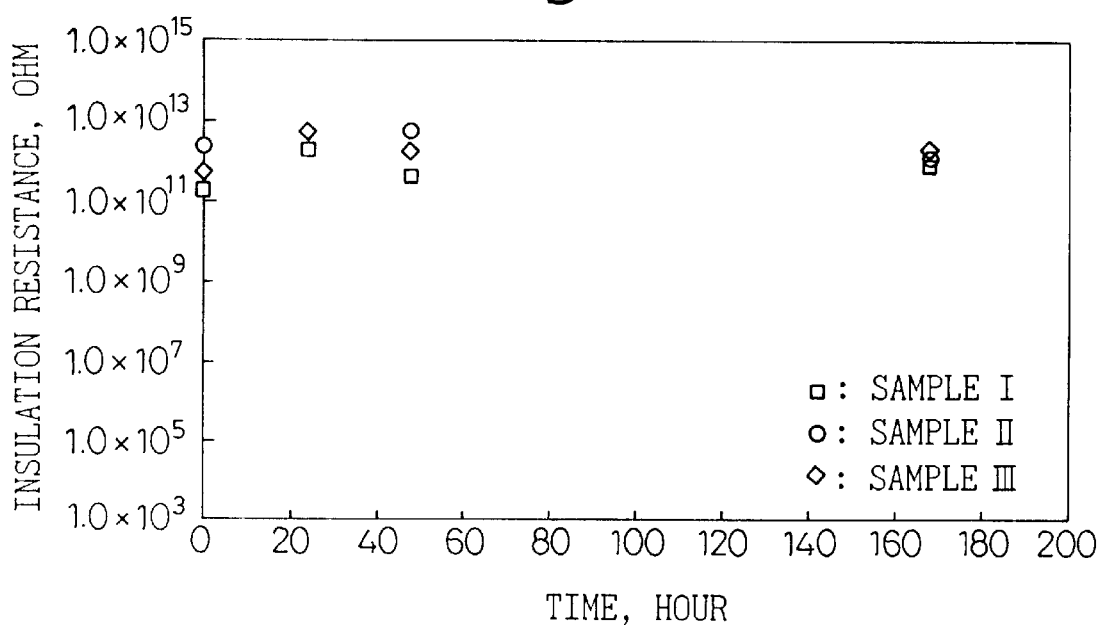
FIG. 12 shows insulation resistances of insulation films after being left to stand in the atmosphere.

It was evaluated whether or not samples having an insulation film whose insulation resistance was restored by sputter etching using an argon gas flow were degraded. Three samples, which had restored insulation resistances of insulation film of $2.10 \times 10^{11}$, $2.50 \times 10^{12}$, and $5.50 \times 10^{11}$ ohms, were left to stand in the atmosphere, and insulation resistances of the insulation film were measured after a lapse of predetermined time. Results are shown in the table below and FIG. 12.

Degradation of Restored Insulation Resistance

| Time, hour | Insulation Resistances, ohms | | |
|---|---|---|---|
| | Sample I | Sample II | Sample III |
| 0 | $2.10 \times 10^{11}$ | $2.50 \times 10^{12}$ | $5.50 \times 10^{11}$ |
| 24 | $2.20 \times 10^{12}$ | $5.80 \times 10^{12}$ | $5.50 \times 10^{12}$ |
| 48 | $4.50 \times 10^{11}$ | $6.00 \times 10^{12}$ | $2.10 \times 10^{12}$ |
| 168 | $1.00 \times 10^{12}$ | $1.30 \times 10^{12}$ | $2.30 \times 10^{12}$ |

These results reveal that the restored insulation resistances were maintained for a long time.

Figure 13:
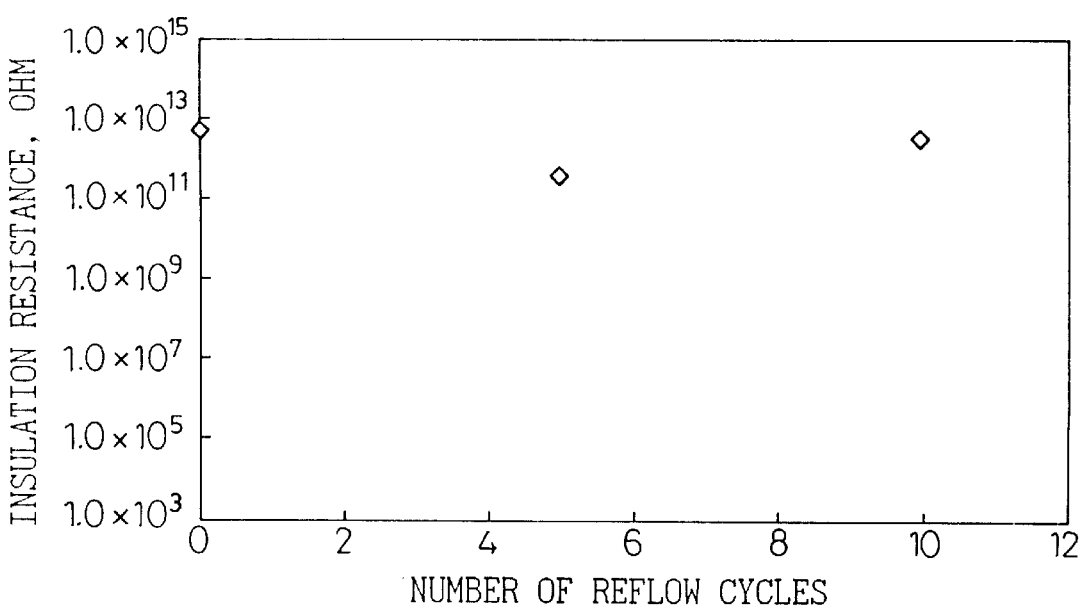
FIG. 13 shows insulation resistances of an insulation film after a reflow cycle test.

A sample having an insulation film having a restored insulation resistance of $5.60 \times 10^{12}$ was subjected to a reflow cycle test in which the sample was heated from room temperature to 240° C. at a rate of 0.25° C./min and was then cooled to room temperature. After a predetermined cycle, an insulation resistance of the insulation film was measured. Results are shown in the table below and FIG. 13.

Reflow Cycle Test

| Number of Reflow Cycles | Insulation Resistances, ohms |
|---|---|
| 0 | $5.60 \times 10^{12}$ |
| 5 | $4.20 \times 10^{11}$ |
| 10 | $4.00 \times 10^{12}$ |

The results reveal that the insulation resistance of the insulation film was not substantially affected by the reflow cycle test.

Although in the embodiment and examples of the invention earlier described, the semiconductor device has a CSP structure in which the via posts 18 for external connection are provided on the rerouting line layer 16, the invention can be, of course, applied to a semiconductor device which does not have such via posts.

Figure 14:
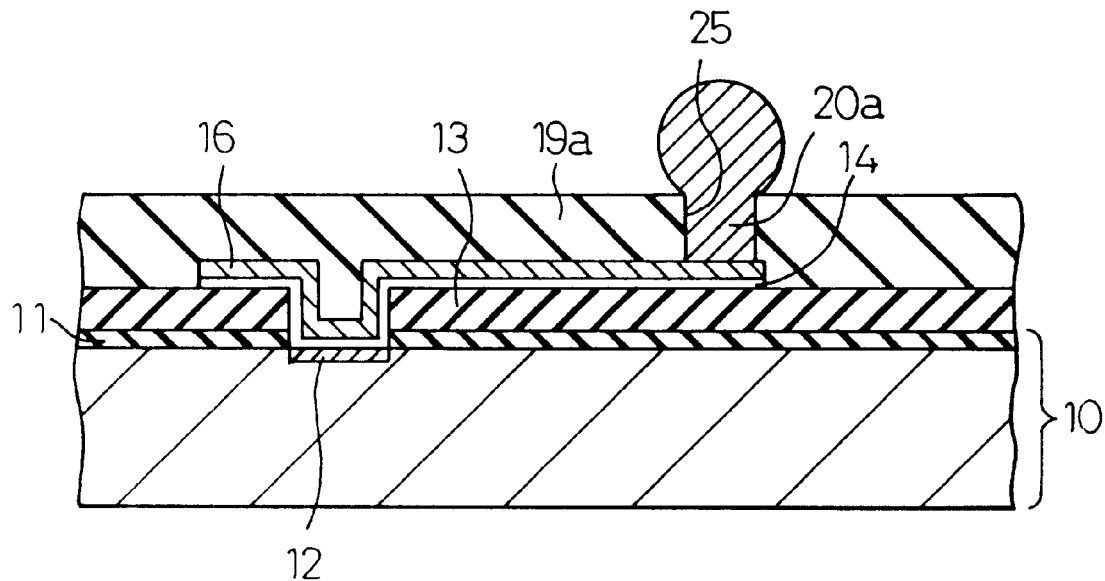
FIG. 14 shows a variant of the semiconductor device according to the invention.

An example of a semiconductor device having no via posts is shown in FIG. 14, which can be produced as follows, for instance. After the formation of the rerouting line layer 16 in the step formerly illustrated in FIG. 2C, the exposed metallic film 14 is removed, and an encapsulating resin layer 19a (FIG. 14) is then formed by, for example, potting so as to cover the polyimide layer 13 and the rerouting line layer 16. Subsequently, via holes 25 are formed in the encapsulating resin layer 19a so as to reach the top surface of the rerouting line layer 16 by laser beam machining or the like. A solder ball 20a for an external connection terminal is then located at the via hole 25, and is partially reflowed to be fixed onto the rerouting line layer 16.

In this case, a treatment for restoring an insulation resistance of the polyimide layer 13 (i.e., sputter etching by $N_2$ gas) is conducted at a step following the step formerly illustrated in FIG. 2C (a step after the removal of the exposed metallic film 14).

In addition, in lieu of the encapsulating resin layer 19a, a layer of solder resist may be formed. The solder resist layer may be formed by either applying a solder resist material to the surface of the wafer 10 provided with the rerouting line layer 16 by screen printing so as to open via holes for the connection between the rerouting line layer 16 and the solder ball 20a through the formed via hole, or applying a photosensitive solder resist material, and then exposing and developing the resultant layer of resist material to be patterned.

Also, although, in the embodiment and examples of the invention earlier described, the semiconductor device uses solder balls for external connection terminals, others may be, of course, used for external connection terminals. For example, a wire may be used for an external connection terminal.

Figure 15:
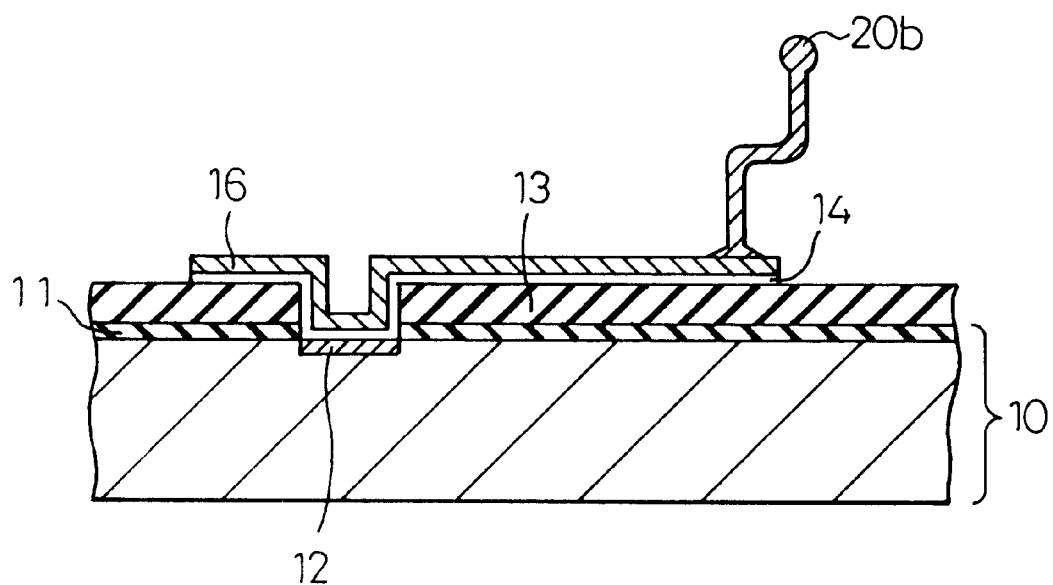
FIG. 15 shows another variant of the semiconductor device according to the invention.

An example of a semiconductor device using wires for external connection terminal is shown in FIG. 15 and can be produced as follows, for instance. After the formation of the resist film 17 in the step formerly illustrated in FIG. 3A, wires 20b of gold (Au) for external connection terminal are bonded to the rerouting line layer 16 through the openings in the resist film 17 by wire bonding technique. Subsequently, the resist film 17 is removed, the surface of the wire 20b is plated with an alloy of nickel and cobalt (Ni—Co) using the metallic film 14 as an electrical power supply layer, and the metallic film 14 exposed on the surface of the wafer 10 is then removed.

In this case, treatment for restoring an insulation resistance of the polyimide layer 13 (i.e., dry etching by $N_2$ gas) is conducted at a step after the removal of the exposed metallic film 14.

As described above, the invention makes it possible to provide a semiconductor device comprising an insulation film covering a semiconductor chip so as to expose electrodes or pads fabricated in the chip and wiring lines located on the insulation film, the insulation film having sufficient insulation properties, and the electrode of the chip being satisfactorily connected to the wiring line on the insulation film.

What is claimed is:

1. A method of producing a semiconductor device comprising an insulation film covering a semiconductor chip so as to expose electrodes or pads fabricated in the chip and wiring lines located on the insulation film and connected to the respective electrodes or pads, the method comprising:

providing a semiconductor chip provided with an insulation film covering the chip so as to expose a conductor layer for electrodes or pads fabricated in the chip, ion milling the surface of the chip provided with the insulation film by a mixed gas of argon and hydrogen, forming a patterned conductor layer for wiring lines on the ion-milled surface of the chip, and dry etching the surface of the chip, provided with the insulation film and the patterned conductor layer, by nitrogen gas.

2. The method of claim 1, wherein the mixed gas of argon and hydrogen used for the ion milling contains 5 to 33% by volume of hydrogen.

3. The method of claim 2, wherein the mixed gas contains 5 to 10% by volume of hydrogen.

4. The method of claim 1, wherein the patterned conductor layer is formed by:

forming a metallic film on the ion-milled surface of the chip, forming a patterned resist film on the metallic film, forming a patterned conductor layer using the resist film as a mask and the metallic film as an electrical power supply layer, and removing the resist film.

5. The method of claim 4, wherein after the removal of the resist film, part of the metallic film, which is exposed by the removal of the resist film and uncovered by the patterned conductor layer, is removed.

6. The method of claim 1, wherein a means to connect the semiconductor device produced to an external electrical circuit is provided on the wiring line.

7. The method of claim 6, wherein the chip is encapsulated so as to expose the means to connect the semiconductor device to an external electrical circuit.

8. The method of claim 1, wherein the insulation film is made of polyimide or polybenzoxazole.

9. The method of claim 1, wherein the conductor layer for electrodes or pads of the chip is made of aluminum or an alloy of aluminum, or copper or an alloy of copper.

10. The method of claim 1, wherein the metallic film is formed of a first layer of chromium and a second layer of copper.

11. The method of claim 1, wherein the conductor layer for wiring lines is made of aluminum or an alloy of aluminum, or copper or an alloy of copper.

12. The method of claim 1, wherein the dry etching is selected from sputter etching and chemical dry etching.

* * * * *